(12) United States Patent
Raravikar et al.

(10) Patent No.: US 7,666,768 B2
(45) Date of Patent: Feb. 23, 2010

(54) THROUGH-DIE METAL VIAS WITH A DISPERSED PHASE OF GRAPHITIC STRUCTURES OF CARBON FOR REDUCED THERMAL EXPANSION AND INCREASED ELECTRICAL CONDUCTANCE

(75) Inventors: Nachiket R. Raravikar, Chandler, AZ (US); Daewoong Suh, Phoenix, AZ (US); Leonel Arana, Phoenix, AZ (US); James C. Matayabas, Jr., Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 326 days.

(21) Appl. No.: 11/541,112

(22) Filed: Sep. 29, 2006

(65) Prior Publication Data

US 2008/0081386 A1 Apr. 3, 2008

(51) Int. Cl.
*H01L 21/20* (2006.01)
(52) U.S. Cl. ...................................................... 438/487
(58) Field of Classification Search .................. None
See application file for complete search history.

(56) References Cited

U.S. PATENT DOCUMENTS

2003/0130114 A1* 7/2003 Hampden-Smith et al. .. 502/180
2007/0045780 A1* 3/2007 Akram et al. ............... 257/621

* cited by examiner

*Primary Examiner*—Charles D Garber
*Assistant Examiner*—Andre' C Stevenson
(74) *Attorney, Agent, or Firm*—Kenneth A. Nelson

(57) ABSTRACT

A method, apparatus and various material-architectures in an electrically conductive through die via formed of a composite material with a continuous phase of matrix metal and a dispersed phase of graphitic structures of carbon, wherein bulk material properties of the composite material differ from similar bulk material properties of the matrix metal.

8 Claims, 8 Drawing Sheets

US 7,666,768 B2

THROUGH-DIE METAL VIAS WITH A DISPERSED PHASE OF GRAPHITIC STRUCTURES OF CARBON FOR REDUCED THERMAL EXPANSION AND INCREASED ELECTRICAL CONDUCTANCE

TECHNICAL FIELD

The invention relates to the field of microelectronics and more particularly, but not exclusively, to stacked packages and electrically conductive through silicon vias.

BACKGROUND

The evolution of integrated circuit designs has resulted in higher operating frequency, increased numbers of transistors, and physically smaller devices. This continuing trend has generated ever-increasing area densities of integrated circuits. To further increase possible densities of integrated circuits, it may be desirable in some instances to electrically couple an active circuit layer on a die to another active circuit layer on the same, or a different, die by means of an electrically conductive through silicon via. A typical through silicon via may simply be a void within a bulk silicon portion of a die filled with a bulk material of approximately uniform composition, for example an alloy of copper.

Many materials may undergo a physical expansion or contraction resulting from a change in temperature. A coefficient of thermal expansion (CTE) may represent a change in unit volume of a bulk material for a unit change in temperature. If a volume of a first bulk material encloses a second volume of a second bulk material with different coefficient of thermal expansion from the first bulk material with zero stress at a given temperature, a change in temperature may cause a non-zero stress to develop at an interface of the different bulk materials. In some cases, under a sufficient change in temperature, or a sufficient number of temperature excursion cycles, a stress at an interface of the different bulk materials may exceed a certain critical stress and cause a permanent deformation or dislocation in one or the other or both bulk materials. Alternatively, performance of an integrated circuit device may degrade from increased stress at an interface of different bulk materials, without either material undergoing a permanent deformation or dislocation.

During a normal manufacturing cycle, packages containing integrated circuits may undergo various processes, some of which may occur at an elevated temperature. For example, a package containing integrated circuits may undergo a solder reflow process, perhaps after being at room temperature. In a solder reflow process, various components within the package, including the integrated circuits and accompanying bulk silicon to which the integrated circuits may be coupled, may approach, or even exceed, a temperature at which a solder reflows, e.g., perhaps 230° C. for a representative Pb-free solder, in contrast to a normal storage temperature of perhaps 25° C. Consequently, a package and its components may undergo a significant temperature change, in the present example 205° C., and thereby experience temperature-induced mechanical stresses.

Further, under normal operation, integrated circuits such as processors dissipate heat that may cause various components within a package, including the integrated circuits and accompanying bulk silicon to which the integrated circuits may be coupled, to undergo temperature variations. While temperature excursions under normal operation may not be as extreme as those experienced in a manufacturing process, throughout a product's design life, a package and its components including the integrated circuits and accompanying bulk silicon to which the integrated circuits may be coupled may undergo a high number of temperature excursions resulting from normal operation.

Copper has a bulk linear CTE of approximately 16.5 ppm/° C. in contrast to silicon, which has a bulk linear CTE of approximately 2.6 ppm/° C. Thus, a unit volume of copper expands considerably more than a unit volume of silicon. Because a typical through silicon via may simply be a void in a bulk silicon portion of an integrated circuit die filled with an alloy of copper and the CTE of each material is almost an order of magnitude different, a mechanical stress may be induced at a copper-silicon interface when the package undergoes a temperature excursion.

For example, FIG. 1(a) represents a group of prior art through silicon vias, showing a portion of a bulk silicon die with integrated circuits 100. The prior art through silicon via 112 illustrated is electrically coupled to metal pads 108 through an electrically conductive seed layer 114. In the embodiment shown, between an electrically conductive seed layer 114 and a portion of the bulk silicon die 102 is a passivation or electrical insulation layer 116. Metal pads 108 and a portion of the bulk silicon die 102 are separated by an interlayer dielectric (ILD) material 104. A layer of ILD 104 disposed between a portion of the bulk silicon die 102 and metal pads 108 may underlie a layer of passivation material 110 or a protection layer 106. FIG. 1(b) and FIG. 1(c) represent a prior art through silicon via suffering stress induced mechanical failures of delamination 120 and die cracking 118, respectively. A prior art through silicon via may have a bulk CTE substantially similar in magnitude to the bulk CTE of the continuous metal phase and substantially different from the bulk CTE of silicon, leading to significant principal stresses under temperature excursions. The significant principal stresses in turn may cause mechanical failures of the integrated circuit such as delamination 120 or die cracking 118. Further, significant principal stresses, without causing delamination 120 or die cracking 118 may cause degraded performance within an integrated circuit as discussed above.

To maintain a mechanical stress resulting from a CTE mismatch below a critical stress of either bulk material for a given temperature excursion, via size may be reduced, spacing between adjacent vias may be increased, or vias may be positioned far from active circuitry. Each of these options may lead to increased die size, lower density circuits or increased cost per die.

DETAILED DESCRIPTION

Figure 1:
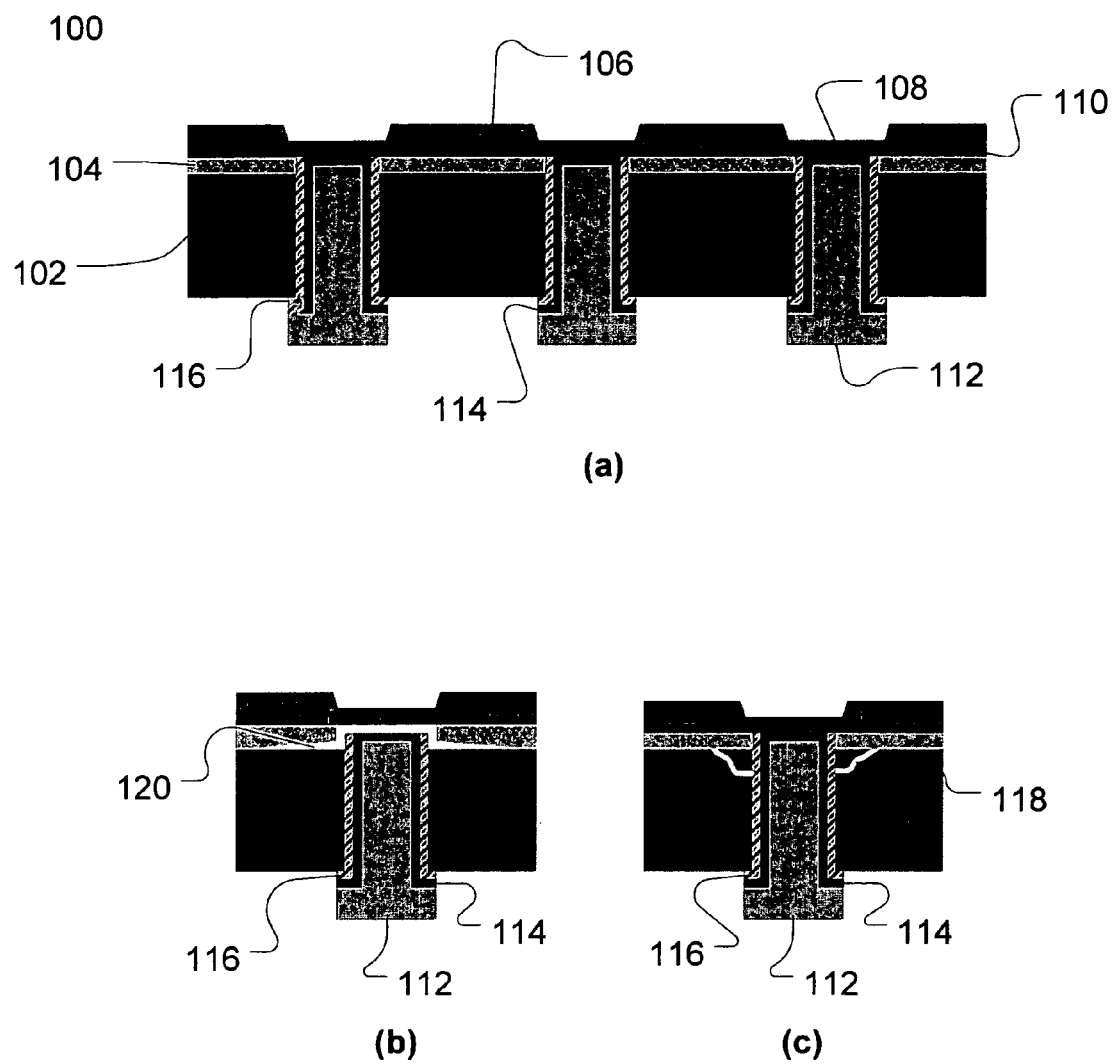
FIG. 1 illustrates a prior art through silicon via formed of a single phase bulk material (FIG. 1(a)) that leads to delamination (FIG. 1(b)) and die cracking (FIG. 1(c)).

Herein disclosed are a method and apparatus for providing a through silicon via with a desirable bulk coefficient of thermal expansion. In the following detailed description, reference is made to the accompanying drawings which form a part hereof wherein like numerals designate like parts throughout, and in which is shown by way of illustration specific embodiments which may be practiced. It is to be understood that other embodiments may be utilized and structural or logical changes may be made without departing from the scope of the claims presented herein. It should also be noted that directions and references (e.g., up, down, top, bottom, primary side, backside, etc.) may be used to facilitate the discussion of the drawings and are not intended to restrict the breadth of application of the claims presented. Therefore, the following detailed description is not to be taken in a limiting sense and the scope of possible embodiments is defined only by the appended claims and their equivalents.

A dispersed phase of graphitic structures of carbon within a continuous phase of metal may alter one or more bulk material properties of a through die via. For example, a resulting electrical resistivity of a composite of a metal matrix forming a continuous phase and an embedded spherical filler forming a dispersed phase may be approximated by the expression, $$k_{composite} = \frac{2k_1 + k_2 + p(k_1 - k_2)}{2k_1 + k_2 - 2p(k_1 - k_2)} k_2,$$

where $k_{composite}$ represents the resulting bulk electrical resistivity, $k_1$ represents the bulk electrical resistivity of the spherical filler and $k_2$ represents the bulk electrical resistivity of the matrix metal and p represents the volume fraction of spherical filler to bulk composite volume.

Further, a resulting CTE of a composite of a metal matrix forming a continuous phase and an embedded spherical filler forming a dispersed phase may be approximated by the expression, $CTE_{composite} = p \cdot CTE_1 + (1-p)CTE_2$, where $CTE_{composite}$ represents the resulting bulk CTE, $CTE_1$ represents the bulk CTE of the spherical filler and $CTE_2$ represents the bulk CTE of the matrix metal and p again represents the volume fraction of spherical filler to bulk composite volume. Consequently, increased volume fraction of a spherical filler with CTE less than a matrix metal may monotonically decrease the bulk CTE of a resulting composite of matrix metal and embedded spherical filler. Although spherical particles are modeled for simplicity of calculation, filler particles reduced to practice may be of arbitrary shape. Graphitic structures of carbon represent a class of such filler particles. For example, a carbon nanotube is a slender graphitic structure with high aspect ratio, low CTE, and high current carrying capacity. A typical aspect ratio (characteristic length divided by characteristic diameter) is on the order of approximately 1000:1. A typical carbon nanotube CTE is on the order of approximately 1 ppm/° C. or less. A typical carbon nanotube current carrying capacity is on the order of approximately $10^9$ A/cm$^2$.

Figure 2:
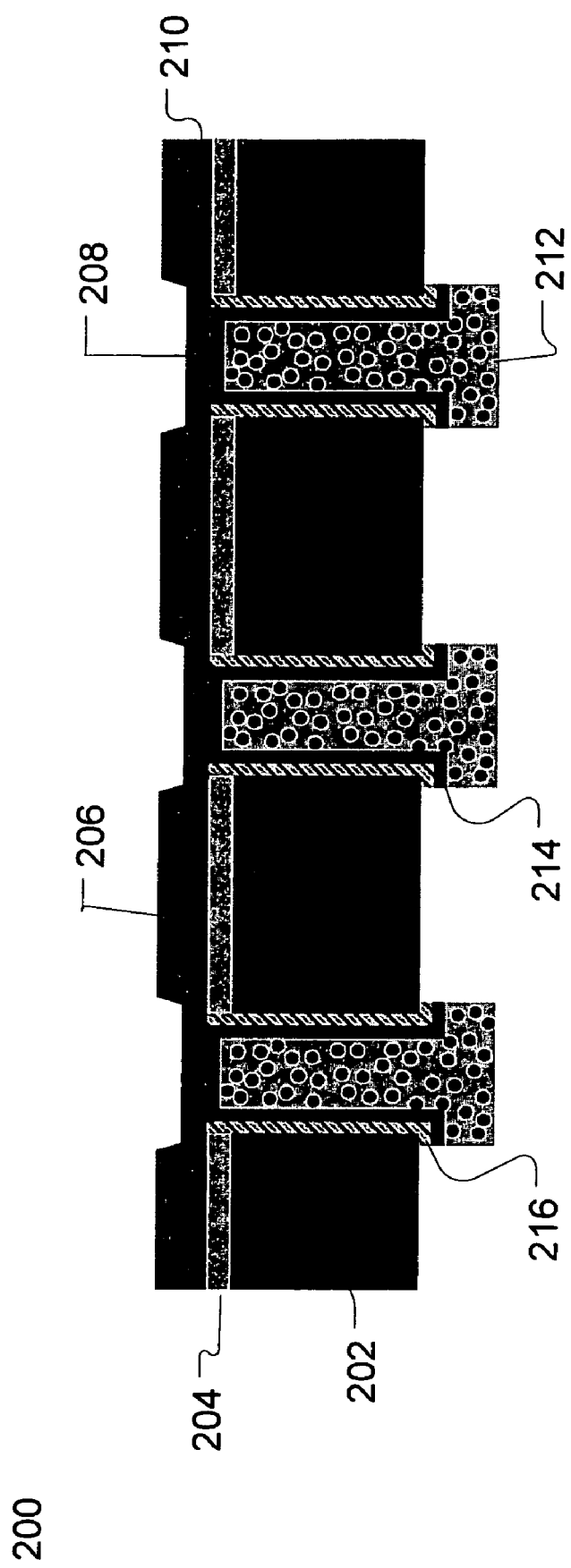
FIG. 2 illustrates a portion of a die with a through die via formed of a composite material with a continuous phase of matrix metal and a dispersed phase of graphitic structures of carbon.

FIG. 2 illustrates one embodiment of a portion of a die 200 with an integrated circuit disposed thereon. The die 200 has an active side and a back side and forms a through-hole. A through die via 212 formed of a composite material fills the through-hole. The composite material of the through die via 212 includes a continuous phase of matrix metal and a dispersed phase of graphitic structures of carbon. In one embodiment, the graphitic structures of carbon include a carbon nanotube. Embodiments of carbon nanotubes include single and multi-walled carbon nanotubes and metal walled nanotubes. In another embodiment, the graphitic structures of carbon include a carbon nanowire. Still another embodiment of a graphitic structure of carbon includes a cone, or frustrum of a cone, (a so-called "horn") structure. Still other embodiments of graphitic structures of carbon include graphite-like structures result from SP2 and SP3 orbital hybridization of carbon atoms such as graphine, a single graphitic sheet wrapped back on itself. Further, the through die via 212 provides electrical connectivity to the integrated circuit. In an embodiment similar to that shown, through die vias 212 may be electrically coupled to metal pads 208 through an electrically conductive seed layer 214. The composite that forms the through die via 212 has a bulk CTE different than the bulk CTE of the matrix metal. In an embodiment wherein a substantial volume fraction of the through die via 212 is formed of a dispersed phase of graphitic structures of carbon, the CTE of the composite may be less than that of the matrix metal. Additionally, the electromigration resistance and electrical conductance of the composite may be different from that of the matrix metal wherein the electromigration resistance and electrical conductance of the composite result partially from the high current carrying capacity of some of the graphitic structures such as carbon nanotubes. Returning to FIG. 2, between an electrically conductive seed layer 214 and a portion of the bulk substrate 202 is shown a passivation or electrical insulation layer 216. Metal pads 208 and a portion of the bulk substrate 202 may be separated by an interlayer dielectric (ILD) material 204. A layer of ILD 204 coupled to a portion of the bulk die substrate 202 between metal pads 208 may underlie a layer of passivation material 210 or a protection layer 206. Many materials may form the bulk die substrate, including silicon, germanium, gallium-arsenide and others.

An embodiment of a composite through die via may use one of many metals or metal alloys for the matrix. Exemplary matrix materials include copper (Cu), gold (Au), aluminum (Al), tungsten (W), silver (Ag) and both eutectic and non-eutectic solders. Exemplary eutectic solders include tin-lead (Pb/Sn) and gold-tin (Au/Sn) solders. Exemplary non-eutectic solders may be based on leaded solders such as Sn/Pb or lead-free solders such as Sn/Ag.

Figure 3:
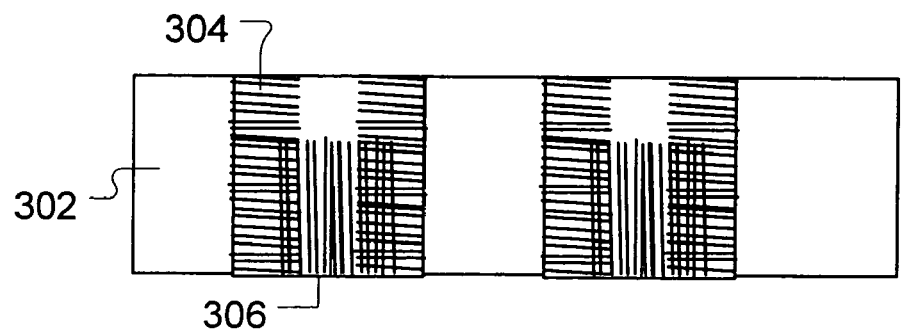
FIG. 3 illustrates a portion of a die, similar to that of FIG. 2, wherein the dispersed phase of graphitic structures of carbon includes a first plurality of graphitic structures of carbon with a first alignment and a second plurality of graphitic structures of carbon with a second alignment substantially perpendicular to the first.
Figure 4:
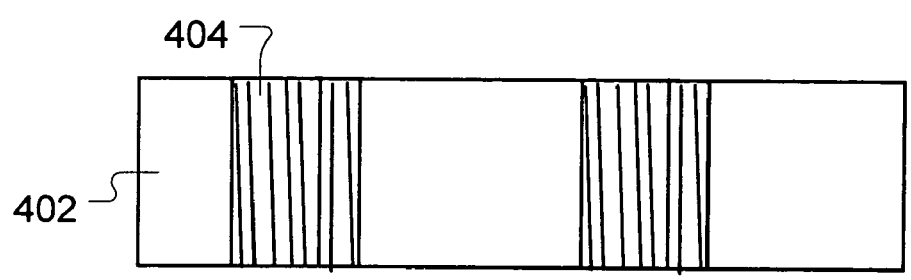
FIG. 4 illustrates a portion of a die, similar to that of FIG. 3, wherein the dispersed phase of graphitic structures of carbon are substantially parallel.
Figure 5:
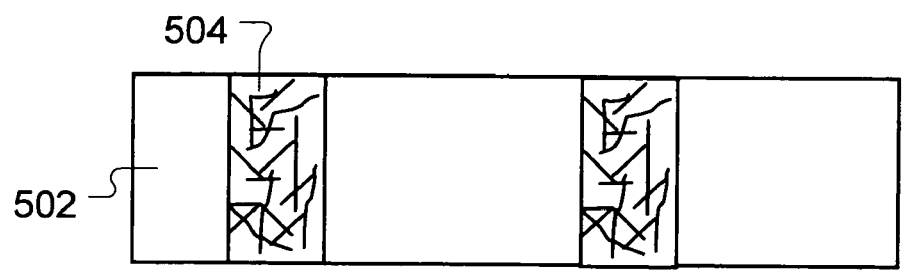
FIG. 5 illustrates a portion of a die, similar to that of FIG. 4, wherein the dispersed phase of graphitic structures of carbon are substantially randomly aligned.

Further, the dispersed phase of graphitic structures of carbon may align according to any of myriad ways. For example, FIG. 3 illustrates an alignment of graphitic structures of carbon wherein a first plurality 306 of graphitic structures of carbon aligns substantially parallel to a centerline of the through-hole formed by the die 302 and a second plurality of graphitic structures of carbon 304 aligned substantially perpendicular to the first, for example, the second plurality shown align radially within the through-hole. FIG. 4 illustrates another embodiment wherein the graphitic structures of carbon 404 align substantially parallel to a centerline of the through-hole formed by the die 402. FIG. 5 illustrates yet another embodiment wherein the graphitic structures of carbon 504 lack alignment order, or randomly align, within the through-hole formed by the die 502. Not illustrated are myriad other embodiments that will be apparent to those skilled in the art. For example, a plurality of graphitic structures of carbon may align substantially radially to the through-hole and a second plurality may lack alignment order, or randomly align.

Figure 6:
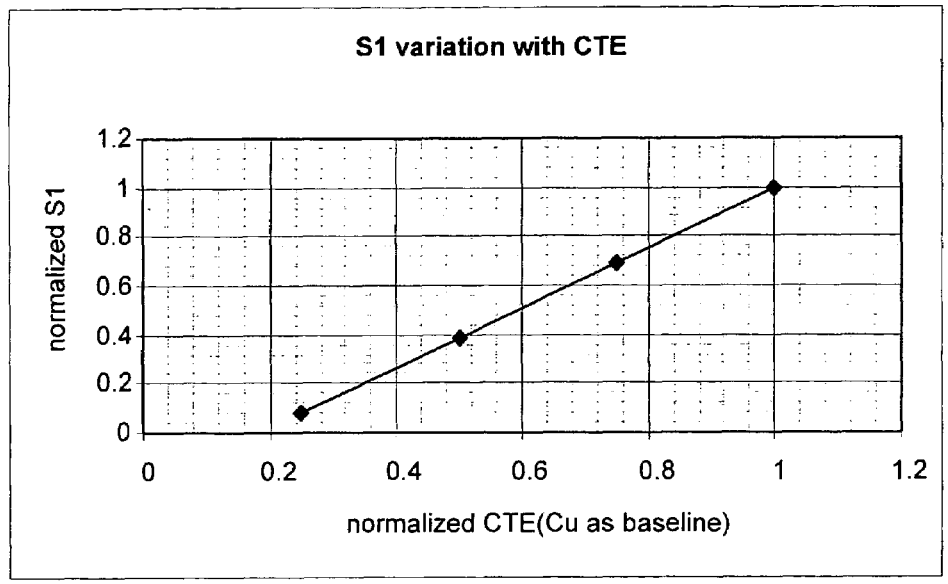
FIG. 6 illustrates variation of normalized primary stress with bulk coefficient of thermal expansion for the material that forms a through silicon via.

FIG. 6 illustrates a graph of results from a finite element simulation of a first principal stress with a normalized bulk CTE (reference CTE is that of copper) of a material used to fill a 20 micron via in an array of vias with 500 micron pitch distributed throughout a bulk die substrate formed of silicon. A normalized CTE of 0.16 represents silicon. The data of FIG. 6 show the first principal stress reduces as the via material's bulk CTE approaches that of the bulk substrate material, in this example silicon.

Figure 7:
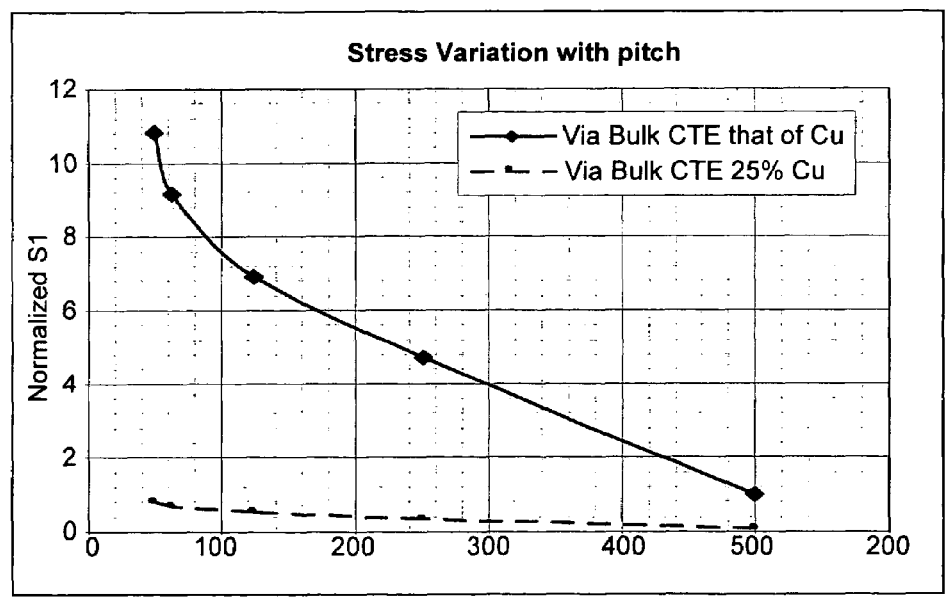
FIG. 7 illustrates variation of normalized primary stress with through silicon via pitch for a via formed of a material with bulk coefficient of thermal expansion equal to that of copper, and with bulk coefficient of thermal expansion equal to 25% that of copper.

FIG. 7 illustrates a graph of further finite element simulation showing a variation of a first principal stress with via pitch for a 20 micron pure copper via and a 20 micron via made of a material with a CTE 25% that of copper in an array of vias with 500 micron pitch distributed throughout a bulk die substrate formed of silicon. The data of FIG. 7 shows the first principal stress decreases significantly at small pitch if a bulk material with reduced CTE forms a via. Further, the data of FIG. 7 shows that a reduced CTE via may result in a lower first principal stress, at smaller pitch, than a conventional CTE via at large pitch.

Figure 8:
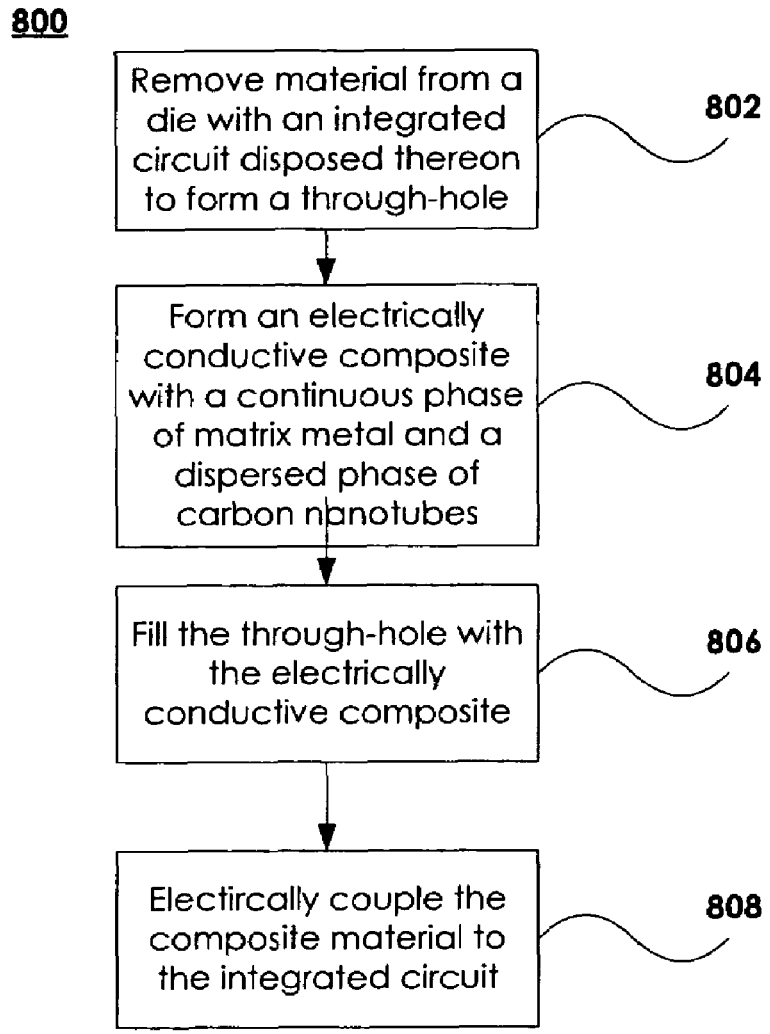
FIG. 8 illustrates a method of manufacture of reduced CTE through die vias.

FIG. 8 illustrates a method 800 of forming a through die via of a composite of a continuous phase of metal and a dispersed phase of graphitic structures of carbon. At block 802, material is removed from a die with an integrated circuit disposed thereon to form a through-hole that extends from an active side of the die to a backside of the die. At block 804, an electrically conductive composite with a continuous phase of matrix metal and a dispersed phase of graphitic structures of carbon is formed. At block 806, the through-hole is filled with the electrically conductive composite. Filling the through-hole may include forming a dispersed phase of carbon nanotubes using a method that includes growing aligned graphitic structures of carbon with a chemical vapor deposition (CVD) process, growing un-aligned, e.g., randomly aligned, graphitic structures of carbon with a CVD process, electrodepositing a carbon nanotube and metal composite, sputtering a composite, jet vapor depositing a composite, or a combination thereof. An electrodeposition process may also include use of a driving potential applied to a first concentration of dispersed graphitic structures of carbon to form a second concentration of dispersed graphitic structures of carbon in the material of the via. At block 808, the composite is electrically coupled to the integrated circuit.

FIG. 9-FIG. 20 illustrate a substrate undergoing a method to manufacture a through-die via formed of a composite with a continuous metal phase and a dispersed phase of graphitic structures of carbon as illustrated by FIG. 2.

Figure 9:
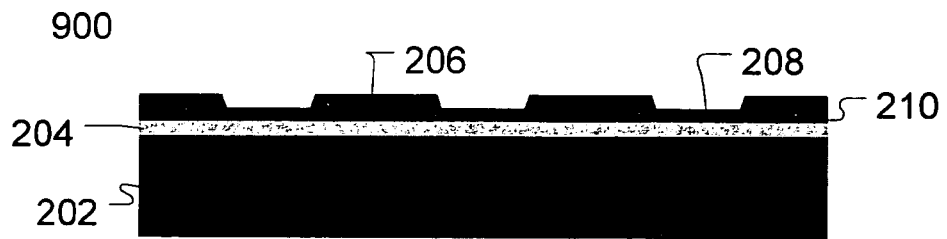
FIG. 9 illustrates a portion of a die.

FIG. 9 illustrates a substrate 900 to which a method of manufacture may be applied. Metal pads 208 and a portion of a die 202 may be separated by an interlayer dielectric (ILD) material 204. In one embodiment, a layer of ILD 204 coupled to a portion of the bulk silicon die 202 between metal pads 208 may underlie a layer of passivation material 210 or a protection layer 206.

Figure 10:
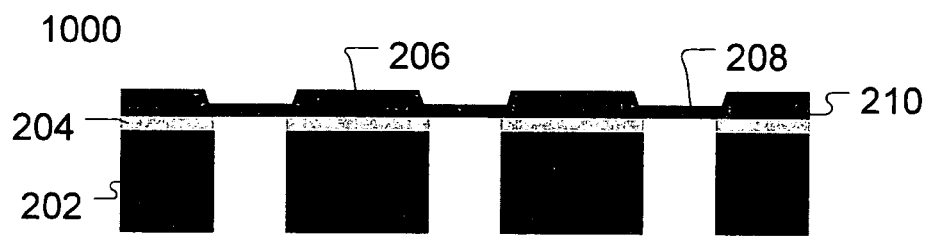
FIG. 10 illustrates the portion of a die of FIG. 9 with several areas of bulk die substrate removed.

FIG. 10 illustrates the substrate of FIG. 9 wherein a portion of a die with integrated circuits 1000 has material removed in a vicinity near a metal pad 208. Removal of die material may be by photolithography followed by a dry or wet etching process. Alternatively, removal may be by a micromachining technique. In one embodiment, a micromachining technique may be blasting, drilling, laser drilling, or another micromachining technique, or a combination thereof. Further, a portion of the ILD 204 in a vicinity near a metal pad may similarly be removed.

Figure 11:
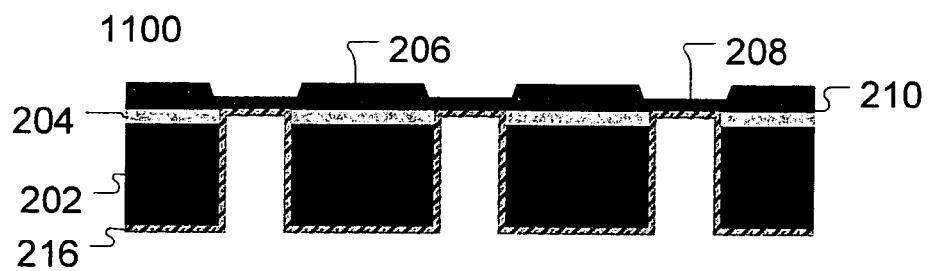
FIG. 11 illustrates the portion of a die of FIG. 10 with a first layer of material deposited on a surface of the bulk die substrate and an underside of a metal pad.

FIG. 11 illustrates the substrate of FIG. 10 showing a portion of a die 1100 with integrated circuits. In FIG. 11, a layer of material 216 is deposited on the surface of the die 202. The layer of material 216 may be a passivation layer. Alternatively, the layer of material 216 may be an electrical insulation material.

Figure 12:
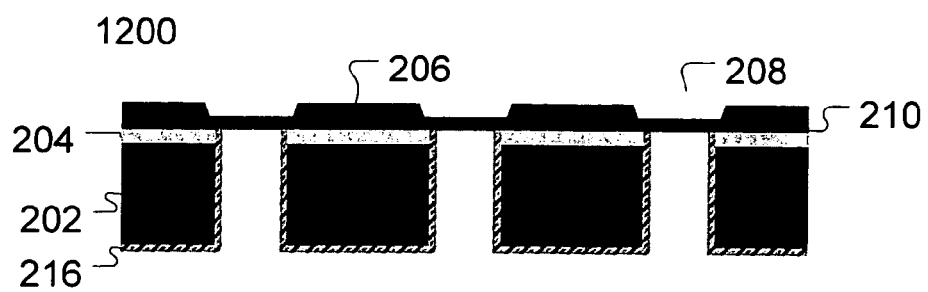
FIG. 12 illustrates the portion of a die of FIG. 11 after exposing the metal pads through partial removal of the first layer of material deposited.

FIG. 12 illustrates the substrate of FIG. 11, showing a portion of a die 1200 with integrated circuits. In FIG. 12, a layer of material 216 proximate to a metal pad 208 has been removed, re-exposing a previously exposed metal pad 208.

Figure 13:
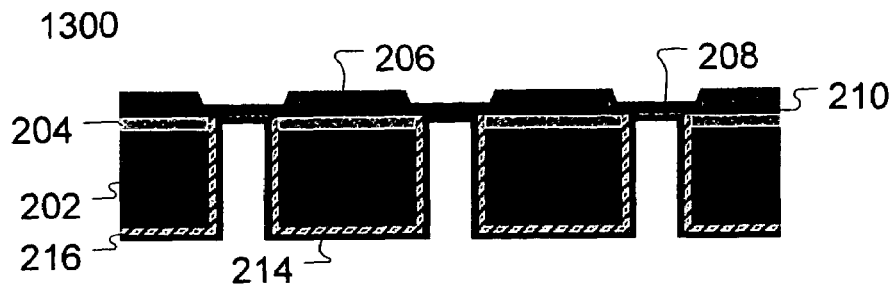
FIG. 13 illustrates the portion of a die of FIG. 12 with a second layer of material deposited over the exposed metal pads and first layer of material.

FIG. 13 illustrates the substrate of FIG. 12, showing a portion of a die 1300 with integrated circuits wherein a second layer of material 214 is deposited on the surface of the previously deposited layer of material 216. The second layer of material 214 may be a barrier layer. Alternatively, the layer of material 214 may be a seed layer to facilitate a later electroplating process.

Figure 14:
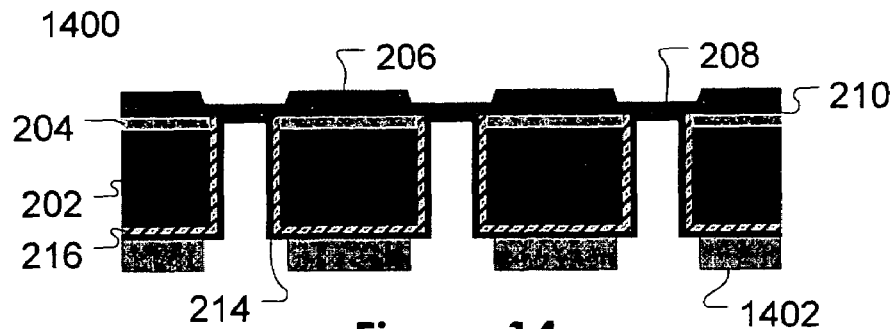
FIG. 14 illustrates the portion of a die of FIG. 13 with photoresist applied.

FIG. 14 illustrates the substrate of FIG. 13, showing a portion of a die 1400 with integrated circuits and a pattern of photoresist 1402 deposited on the surface of the previously deposited layer of material 214.

Figure 15:
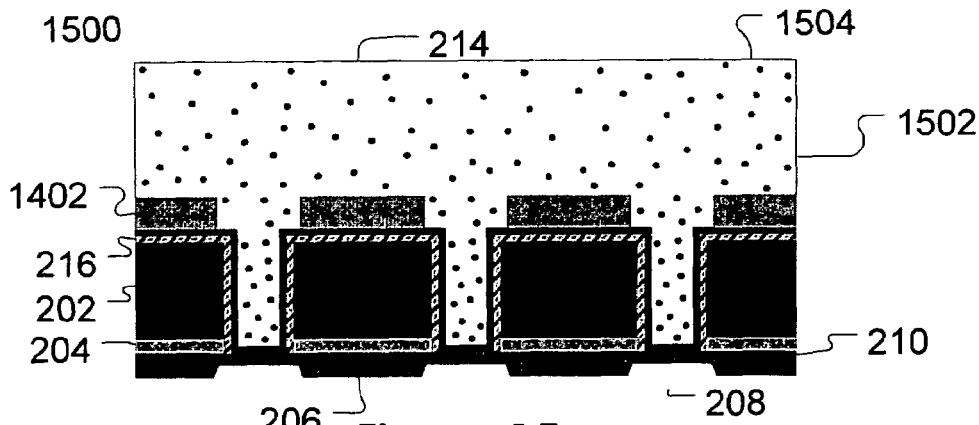
FIG. 15 illustrates the portion of a die of FIG. 14 immersed in an electrolytic bath with dispersed graphitic structures of carbon.

FIG. 15 illustrates the substrate of FIG. 14 showing a portion of a die 1500 with integrated circuits immersed in an electroplating bath 1502. In FIG. 15, the electroplating bath 1502 may contain in solution or suspension particles 1504 of graphitic structures of carbon that have reduced CTE relative to a deposited matrix metal.

Figure 16:
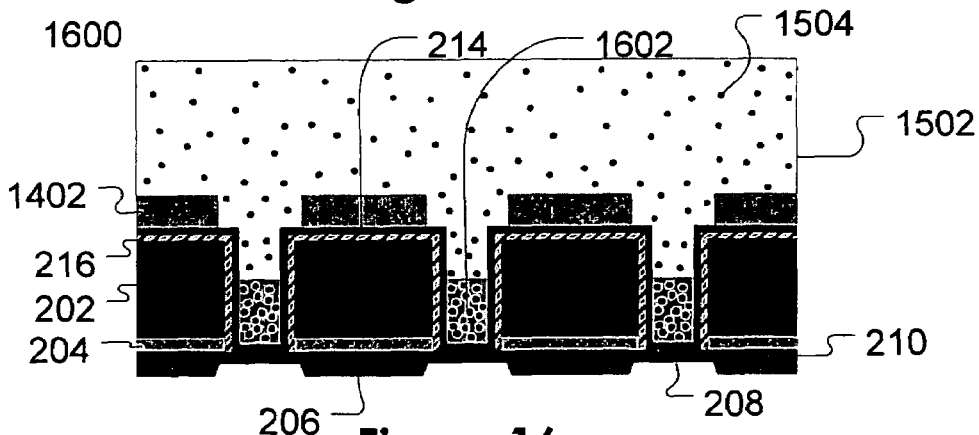
FIG. 16 illustrates the portion of a die of FIG. 15 with partially deposited through silicon vias with dispersed graphitic structures of carbon.

FIG. 16 illustrates the substrate of FIG. 15 showing a portion of a die 1600 with integrated circuits immersed in an electroplating bath 1502. In FIG. 16, a portion of a via 1602 is deposited within a void previously generated in the die 202. In one embodiment, the portion of a via 1602 includes a continuous phase of matrix metal and a dispersed phase of graphitic structures of carbon. During an electroplating process, the graphitic structures of carbon may be co-deposited in a portion of the through die via 1602. Further, to aid co-deposition of the graphitic structures of carbon 1504, a driving potential may be applied. The driving potential may be gravity, or some other driving potential made to act on the electroplating bath 1502 or graphitic structures of carbon 1504.

Figure 17:
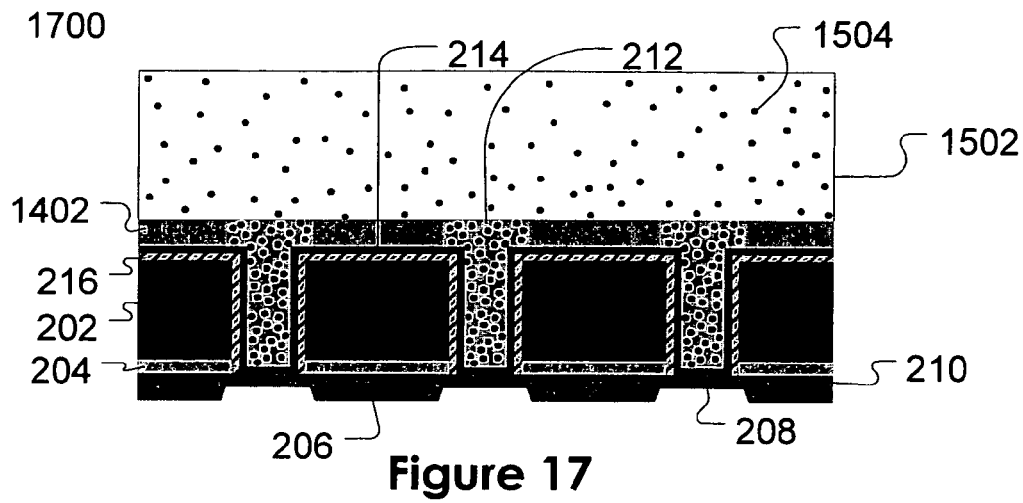
FIG. 17 illustrates the portion of a die of FIG. 16 with fully deposited through silicon vias with dispersed graphitic structures of carbon.

FIG. 17 illustrates a portion of the substrate of FIG. 16 showing a die 1700 with integrated circuits immersed in an electroplating bath 1502. In FIG. 16, a through die via 212 is fully deposited. In one embodiment, the via is formed of a composite material formed of a continuous phase of metal matrix with greater CTE than the die 202 and a dispersed phase of graphitic structures of carbon with a CTE less than the CTE of the metal matrix, wherein the composite exhibits a bulk CTE less than the bulk CTE of the matrix metal. In one embodiment, the die 202 is substantially silicon.

Figure 18:
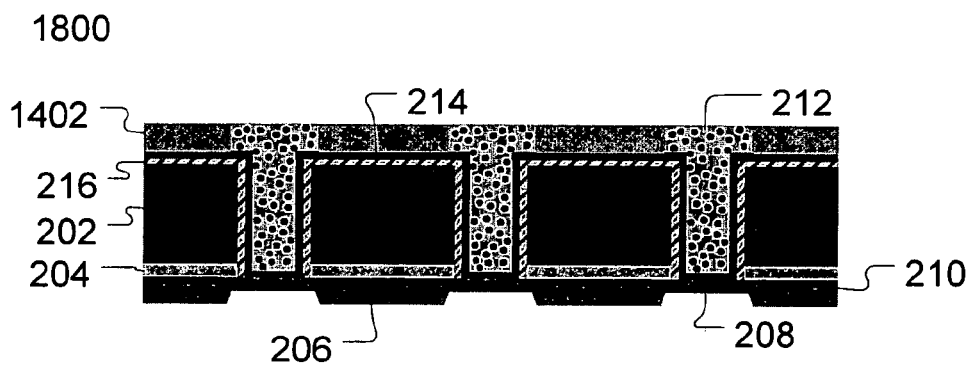
FIG. 18 illustrates the portion of a die of FIG. 17 with the electrolytic bath removed.

FIG. 18 illustrates the substrate of FIG. 17, showing a portion of a die 1800 with integrated circuits with the electroplating bath removed.

Figure 19:
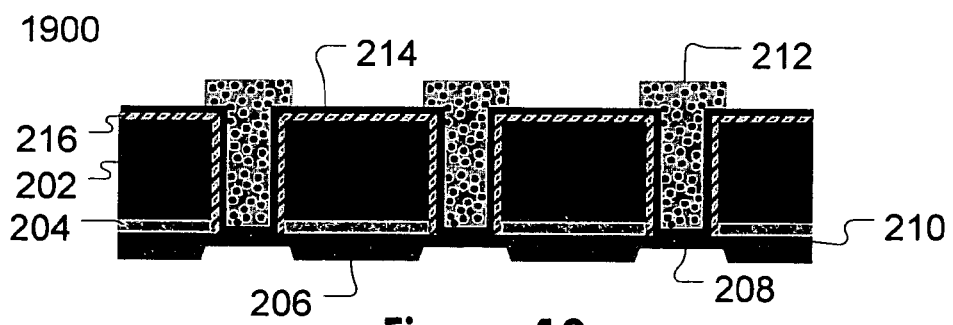
FIG. 19 illustrates the portion of a die of FIG. 18 with the photoresist removed.

FIG. 19 illustrates the substrate of FIG. 18, showing a portion of a die 1900 with integrated circuits, wherein the pattern of photoresist has been removed.

Figure 20:
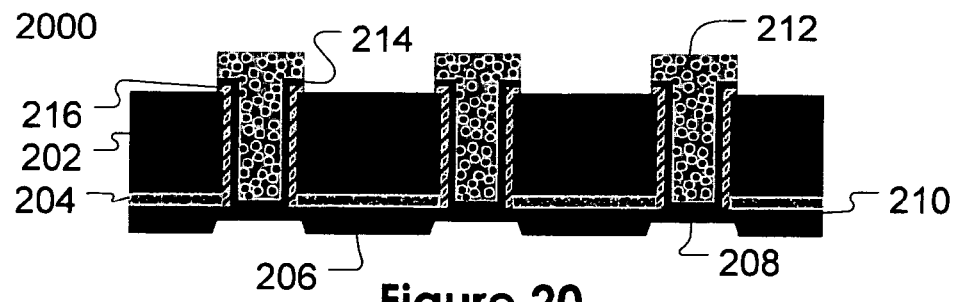
FIG. 20 illustrates the portion of a die of FIG. 19 with the first and second layers of material removed in regions between the through die vias.

FIG. 20 illustrates the substrate of FIG. 19 showing a portion of a die 2000 with integrated circuits and a first layer 214 and second layer 216 of material etched among the newly deposited vias 212, exposing a portion of die 202.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope intended. For example, an alternative embodiment may exist where filler particles are packed into an open via hole within a die and a chemical vapor deposition (CVD) or physical vapor deposition (PVD) process (e.g., sputtering, evaporation, jet vapor deposition) may be used to fill in any volume in the through hole unfilled by packed particles. Yet another embodiment may exist wherein solder balls containing filler particles may reflow into an open via hole within a die. Still another embodiment may reflow solder balls containing filler particles under vacuum to avoid air filled voids within a finished via. Thus, those with skill in the art will readily appreciate implementation may be achieved using a very wide variety of embodiments. This application is intended to cover any adaptations or variations of the embodiments discussed herein. Therefore, it is manifestly intended only the claims and the equivalents thereof limit the scope of possible embodiments.

What is claimed is:

1. A semiconductor package comprising:
    an integrated circuit disposed on a die with an active side and a back side, wherein the die forms a through-hole that extends between the active side and the back side;
    a though die via formed of a composite material that fills the through-hole, wherein the composite material includes a continuous phase of matrix metal and a dispersed phase of graphitic structures of carbon, and wherein the through die via provides electrical connectivity to the integrated circuit, wherein a first substantial plurality of graphitic structures of carbon that form the dispersed phase align substantially parallel to a centerline of the through-hole, wherein the centerline is perpendicular to the active side and the back side of the die, and wherein a second substantial plurality of graphitic structures of carbon that form the dispersed phase align perpendicularly to the first substantial plurality of graphitic structures of carbon.

2. The semiconductor package of claim 1, wherein the graphitic structures of carbon further comprise a carbon nanotube.

3. The semiconductor package of claim 1, wherein a bulk material property of the composite material selected from the group consisting of a coefficient of thermal expansion, an electrical conductance, an electromigration resistance, or a combination thereof, differs from a similarly selected bulk material property of the matrix metal.

4. The semiconductor package of claim 1, wherein the matrix metal comprises a chosen one of the group consisting of copper (Cu), gold (Au), platinum (Pt), palladium (Pd), titanium (Ti), nickel (Ni), aluminum (Al), tungsten (W), silver (Ag), eutectic solder, and non-eutectic solder.

5. The semiconductor package of claim 4, wherein the eutectic solder comprises one of the group consisting of tin-lead (Pb/Sn) solder, silver-fin (Pb/Ag)and gold-tin (Au/Sn) solder.

6. The semiconductor package of claim 4, wherein the non-eutectic solder comprises one of the group consisting of a leaded solder and a lead-free solder.

7. The semiconductor package of claim 1, wherein a majority of graphitic structures of carbon that form the dispersed phase align substantially parallel to a centerline of the through-hole, wherein the centerline is perpendicular to the active side and the back side of the die.

8. The semiconductor package of claim 1, wherein a majority of graphitic structures of carbon that form the dispersed phase randomly align within the composite material.

* * * * *